United States Patent

Zappala

[11] 4,223,367
[45] Sep. 16, 1980

[54] CIRCUIT FOR DRIVING SAW-TOOTH CURRENT IN A COIL

[75] Inventor: Giuseppe Zappala, Turin, Italy

[73] Assignee: Indesit Industria Elettrodomestici Italiana S.p.A., Italy

[21] Appl. No.: 914,391

[22] Filed: Jun. 12, 1978

[30] Foreign Application Priority Data

Jun. 13, 1977 [IT] Italy .................. 68364 A/77
Jun. 27, 1977 [IT] Italy .................. 68475 A/77

[51] Int. Cl.² ........................................... H03K 4/83
[52] U.S. Cl. ................................ 361/156; 361/159; 315/408
[58] Field of Search ............ 361/152, 155, 159, 156, 361/160; 315/408, 371

[56] References Cited

U.S. PATENT DOCUMENTS

| | | | |
|---|---|---|---|
| 3,043,992 | 7/1962 | Schwartz | 361/160 |
| 3,825,793 | 7/1974 | Dietz | 315/371 |
| 3,879,636 | 4/1975 | Lamoureux | 315/371 |
| 3,950,674 | 4/1976 | Joosten et al. | 315/408 X |
| 3,999,102 | 12/1976 | Gent et al. | 315/408 X |
| 4,063,134 | 12/1977 | Iida | 315/371 |
| 4,099,101 | 7/1978 | Teuling | 315/408 |
| 4,122,363 | 10/1978 | Zappala' et al. | 315/408 |
| 4,134,047 | 1/1979 | Zappala' | 315/408 |
| 4,140,949 | 2/1979 | Terry | 315/371 |
| 4,144,479 | 3/1979 | Farina et al. | 315/408 |

FOREIGN PATENT DOCUMENTS

| | | | |
|---|---|---|---|
| 2043862 | 3/1972 | Fed. Rep. of Germany | 315/408 |
| 2514102 | 10/1975 | Fed. Rep. of Germany | 315/408 |
| 2749552 | 6/1978 | Fed. Rep. of Germany | 315/408 |

*Primary Examiner*—J. D. Miller
*Assistant Examiner*—L. C. Schroeder
*Attorney, Agent, or Firm*—Lerner, David, Littenberg & Samuel

[57] ABSTRACT

A circuit arrangement for driving saw-tooth current through a coil comprising a trace capacitor and a retrace capacitor, connected in a closed loop with said coil, a current recovery diode connected in parallel with the said retrace condenser, a first controllable switch, having a control electrode operative to receive periodic control signals to render the said first switch conductive during part of the trace interval, and an inductance connecting the said first switch to a power supply source in which energy is stored during the interval in which the said first switch is conductive and from which energy is supplied to the said first retrace capacitor by way of a second diode and a third capacitor when the said first switch is not conductive, the energy stored in the said third capacitor when the said first switch is not conductive, being restored to the supply source when the said first switch is conductive by way of a second controllable switch.

10 Claims, 4 Drawing Figures

CIRCUIT FOR DRIVING SAW-TOOTH CURRENT IN A COIL

The present invention relates to a circuit arrangement for driving a saw-tooth current, with a trace or scanning interval and a retrace or fly back interval, in a coil, in particular the line deflection coil of a television tube, the circuit comprising a first trace capacitor and a first retrace capacitor, connected to the said coil to form a closed loop, a first diode connected in parallel to the said first retrace capacitor, a first controllable switch, in particular a transistor, having a control electrode to which periodic control signals are applied to make the said first switch conductive during part of the trace interval and an inductance connecting the said first switch to a power supply source in which energy is stored during the interval that the said first switch is conductive and from which energy is supplied to the said first retrace condenser by way of a second diode and a third capacitor during the interval that the said first switch is not conductive, the energy stored in the said third condenser, when the said first switch is not conductive, being returned to the supply source when the said first switch is conductive. A circuit of this type is described in patent application No. 67991-A/77 filed on 4th May 1977, by the present applicant.

The present invention seeks to provide an improved circuit arrangement for driving saw-tooth current in a coil having high efficiency.

According to the present invention there is provided a circuit arrangement for driving saw-tooth current through a coil comprising a first trace capacitor and a retrace capacitor connected in a closed loop with said coil, a current recovery diode connected in parallel with the said retrace condenser, a first controllable switch, having a control electrode operative to receive periodic control signals to render the said first switch conductive during part of the trace interval, and an inductance connecting the said first switch to a power supply source in which energy is stored during the interval in which the said first switch is conductive and from which energy is supplied to the said first retrace capacitor by way of a second diode and a third capacitor when the said first switch is not conductive, the energy stored in the said third capacitor when the said first switch is not conductive, being restored to the supply source when the said first switch is conductive by way of a second controllable switch.

The invention will now be described, by way of a non-limiting example, with reference to the accompanying drawings in which:

FIG. 1 shows the circuit diagram of a colour television line output stage with a circuit for East-West modulation which, as is known, is required for correcting the pin cushion distortion of the deflection yoke, especially on recent types of in-line-gun cathode ray tubes.

Figure 1:
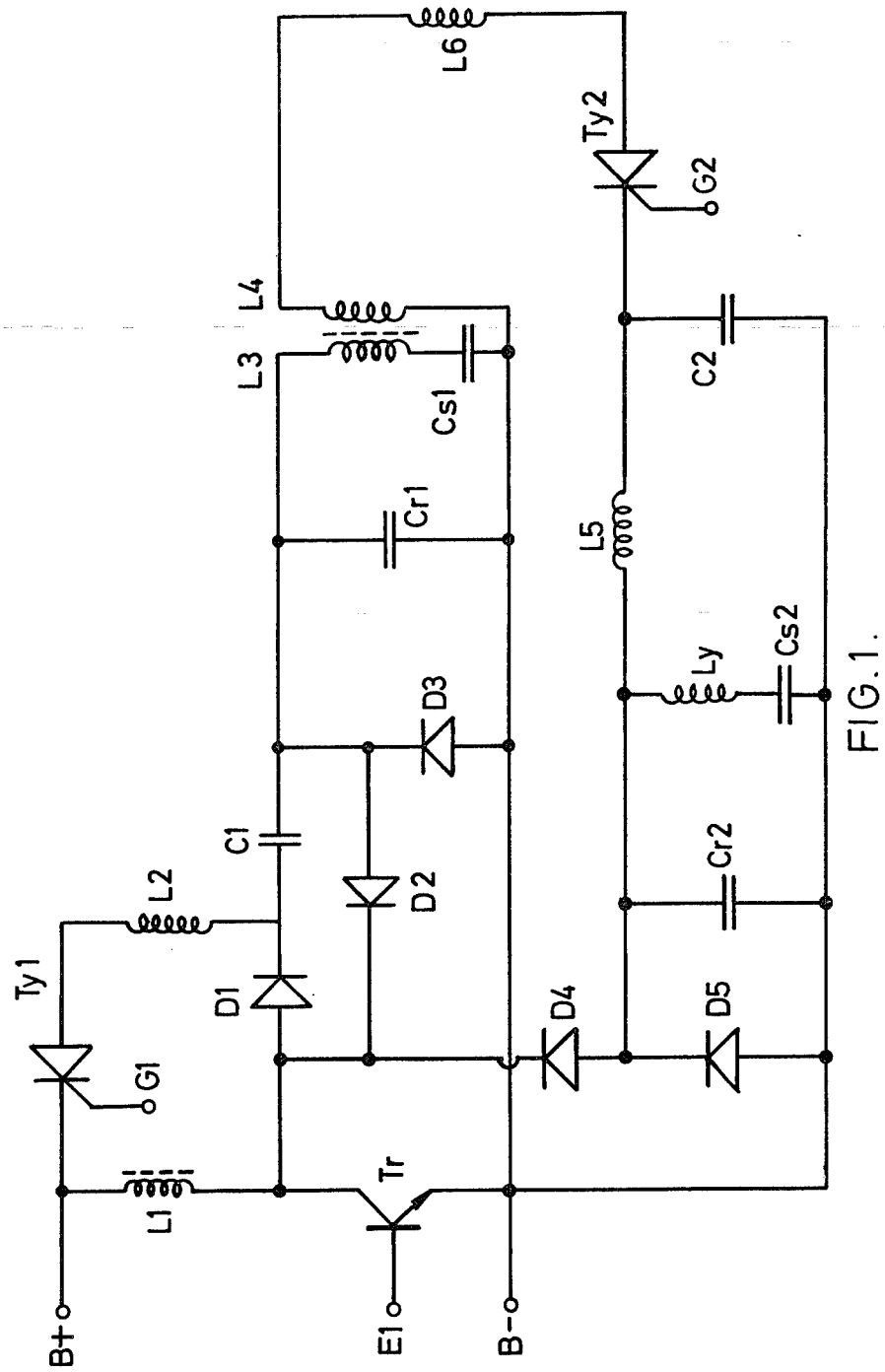
FIG. 1 is a circuit diagram of a horizontal deflection circuit with East-West modulation for a colour television set, using the present invention.

In FIG. 1, B+ and B− are poles of a d.c. voltage supply source. $E_1$ is the control (base) electrode of deflection transistor Tr; terminal $E_1$ which receives triggering signal for making transistor Tr conductive during the second part of the scanning interval (saw-tooth trace interval). Terminals $G_1$ and $G_2$ are the control (gate) electrodes of the two thyristors $T_{y1}$ and $T_{y2}$ to which short firing signals are applied.

These, like the transistor base signal, are taken as being generated by known circuits not shown in the diagram.

Coil $L_y$ is the deflection coil which, in practice, may consist of a number of windings arranged in parallel or in series with one another using known techniques.

Coil $L_y$ is connected to a retrace capacitor $C_{r2}$ and trace capacitor $C_{s2}$.

Figure 2:
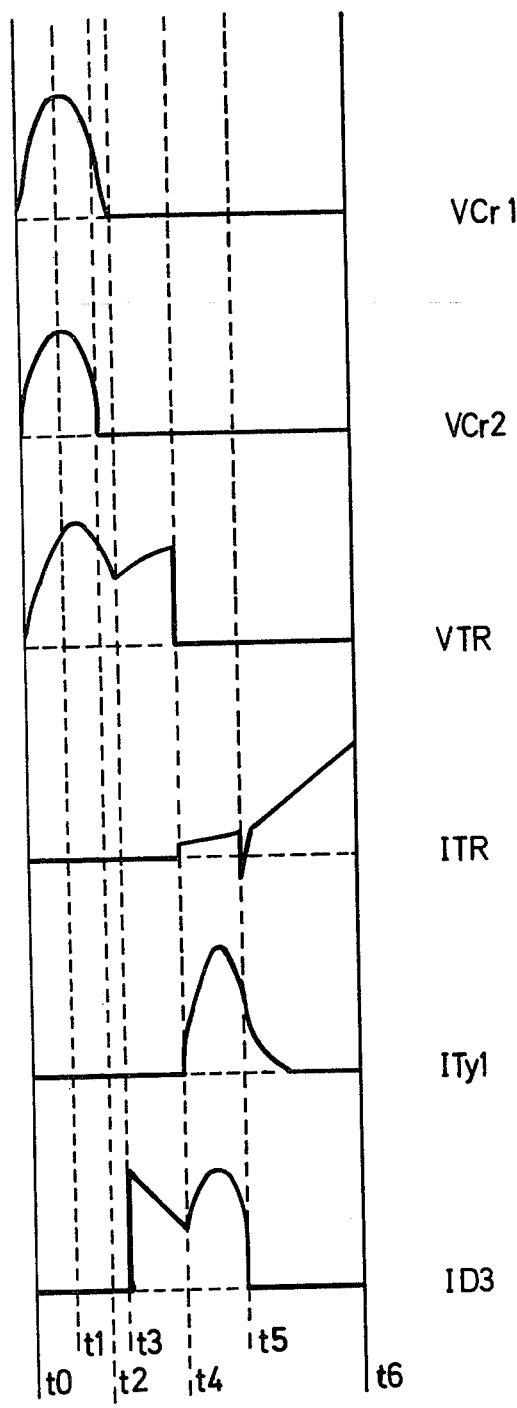
FIG. 2 shows the current and voltage curves (not to scale) of the main parts on the FIG. 1 circuit.

The switching of a current recovery diode $D_5$ and transistor $T_r$ (through a diode $D_4$) produces a voltage at the terminals of $C_{r2}$ with a well-known, characteristic curve (see $V_{Cr2}$ in FIG. 2). This determines the retrace or fly back interval ($t_0$–$t_2$) and the trace interval ($t_2$–$t_6$) of the saw-tooth current in coil $L_y$.

A similar circuit is formed by a coil $L_3$ (which acts as the primary of the transformer consisting of $L_3$ and $L_4$ and which could have additional windings for supplying other circuits), a capacitor $C_{r1}$ and a capacitor $C_{s1}$.

A voltage similar to that produced at the terminals of $C_{r2}$ is also produced at the terminals of $C_{r1}$ (see $V_{Cr1}$ in FIG. 2). This too has a retrace interval ($t_0$–$t_3$) and a trace interval ($t_3$–$t_6$) although usually of different length from the $V_{Cr2}$ voltage intervals.

This results in a flow of saw-tooth current in coil $L_3$ with switching being performed, in this case, by parallel recovery diode $D_3$ and transistor $T_r$ (through diode $D_2$).

The energy required for making up for circuit losses is supplied to the two circuits described as follows:

When transistor $T_r$ is made conductive by the pilot signal applied to terminal $E_1$ (interval $t_4$–$t_6$ in FIG. 2), coil $L_1$ is charged with energy supplied by the supply unit connected to terminals B+ and B−. During the next interval ($t_0$–$t_4$) in which $T_r$ is non-conductive, the current in coil $L_1$ flows through diode $D_1$ to charge capacitors $C_1$ and $C_{r1}$, during interval $t_0$–$t_3$, and $C_1$ exclusively, during interval $t_3$–$t_4$ in which $D_3$ is conductive.

The energy thus supplied to $C_1$ is then sent back to the supply unit through $L_2$ and $T_{y1}$ during the interval in which $T_{y1}$ is conductive.

For the circuit to work properly, this energy must be sent back before instant $t_6$, otherwise $C_1$ would remain charged preventing the next pick-up of energy from the supply unit.

Advantage may be taken to synchronize the control (firing) pulse for $T_{y1}$ (applied to its gate $G_1$) with the control signal of $T_r$, that is, firing of $T_{y1}$ can be made to occur at the same instant in which $T_r$ is made conductive.

Suitable sizing of inductor $L_2$ ensures the current in $T_{y1}$ is not excessive and $T_{y1}$ is disabled prior to $t_6$.

The energy supplied each cycle to $C_{r1}$ serves to compensate the losses of both circuits $L_3$ and $L_y$.

$C_{r2}$ is supplied with energy through the secondary coil $L_4$, connected to coil $L_3$, and through thyristor $T_{y2}$ and coil $L_5$.

The firing pulse for $T_{y2}$ is applied at instant $t_1$ within the interval $t_0$–$t_3$. By bringing this instant forward or delaying it, the energy supplied to circuit $L_y$–$C_{r2}$ can be increased or reduced so as to modulate the amplitude of the current flowing in $L_y$ without noticeably affecting the amplitude of the current flowing in $L_3$.

In fact, a tendency has been noticed for the conduction time of $T_r$ to vary automatically so as to keep the voltage at the terminals of $C_{r1}$ more or less constant in the face of variations in the current of $L_y$ made by varying the firing instant of $T_{y2}$.

Inductor $L_6$ serves to limit the current in thyristor $T_{y2}$.

Figure 3:
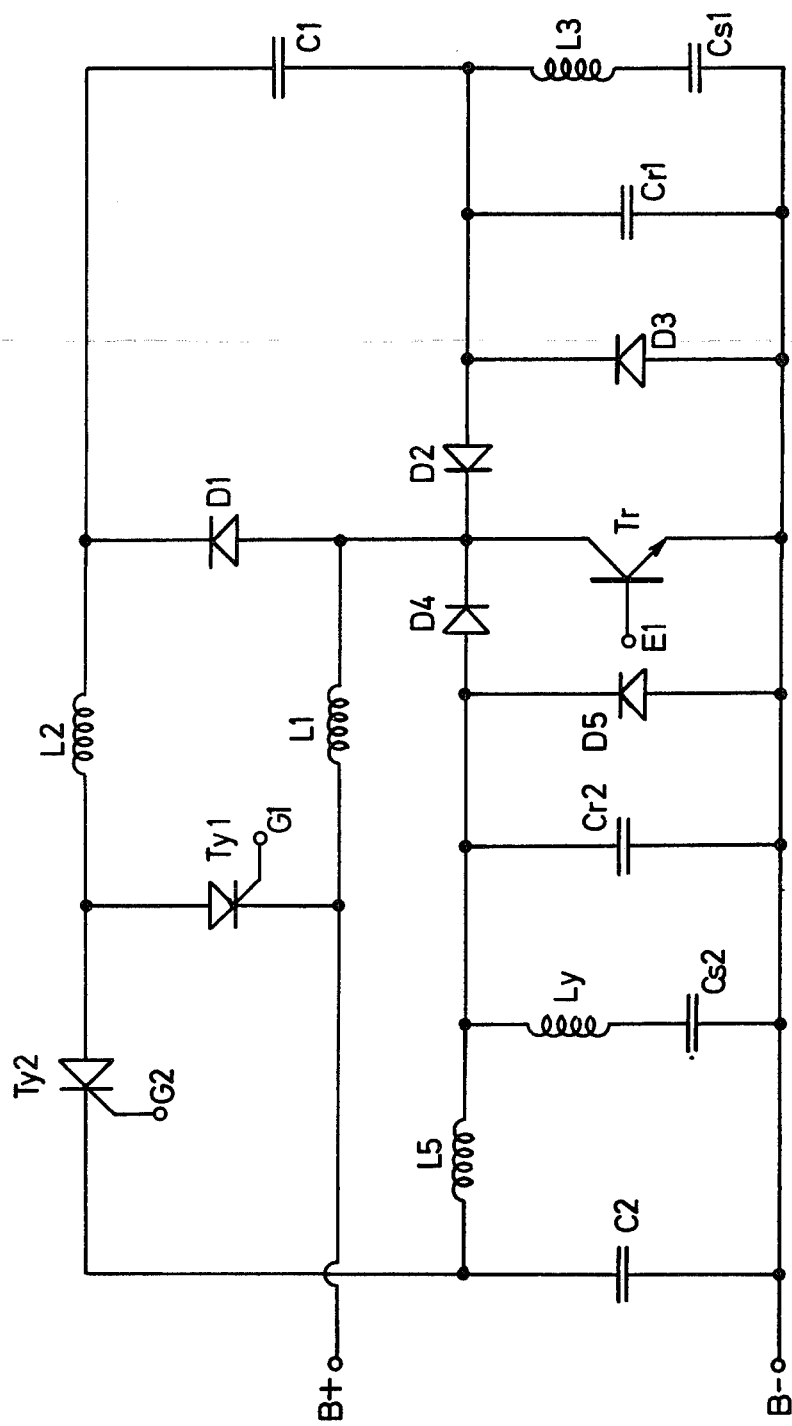
FIG. 3 shows the circuit diagram of a colour television horizontal deflection circuit with E-W modulation according to another embodiment of the present invention.

FIG. 3 shows the circuit diagram of another line output stage for a colour television receiver with E-W modulation, which, as earlier mentioned, is necessary correction of the pin cushion distortion introduced by the deflection yoke, particularly with the recently developed picture tubes with in-line guns.

In FIG. 3 the elements which serve the same function as the corresponding elements of FIG. 1 have been allocated the same reference numerals as in FIG. 1.

In FIG. 3 B+ and B− represent the d.c. power supply connection terminals; $E_1$ is the control terminal (base) of the final deflection transistor $T_r$; terminal $E_1$ is supplied with the driving signal which makes transistor T conduct during the second part of the scanning interval (saw-tooth trace).

Terminals $G_1$ and $G_2$ are the gate leads of the two thyristors $T_{y1}$ and $T_{y2}$; they are supplied with appropriate control signals of short duration (trigger signals).

These signals, like the one sent to the base of the transistor, are generated by well known circuits and are not shown here.

$L_y$ represents the deflection coil; it may actually consist of several windings either in series or in parallel, according to known techniques.

The deflection coil $L_y$ is connected to a retrace capacitor $C_{r2}$ and to a trace capacitor $C_{s2}$.

Figure 4:
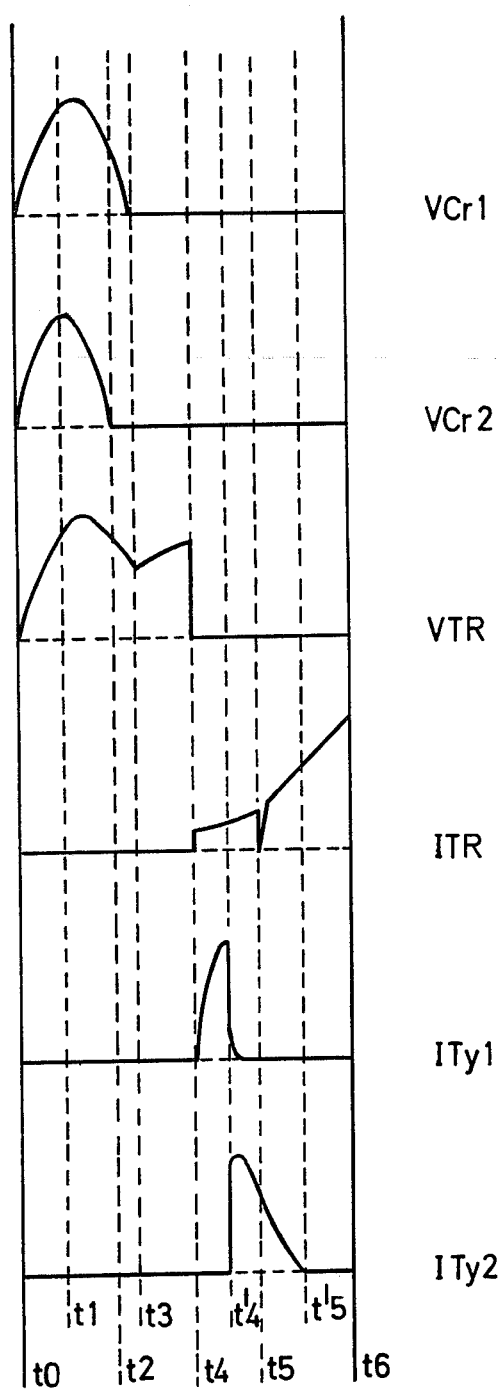
FIG. 4 shows current and voltage out-of-scale curves in the main components of the circuit shown in FIG. 3.

By virtue of the switching carried out by the current recovery diode $D_5$ and by transistor $T_r$ (via diode $D_4$) a voltage is generated across capacitor $C_{r2}$ which has a known shape (see $V_{Cr2}$ in FIG. 4). It defines the saw-tooth current retrace and trace intervals, respectively ($t_0-t_2$) and ($t_2-t_6$), in the deflection coil $L_y$.

A similar circuit is formed by coil $L_3$ (which may represent the primary winding of a service transformer, with one or more secondary windings) and by capacitors $C_{r1}$ and $C_{s1}$.

A voltage is generated across capacitor $C_{r1}$ similar to the voltage across capacitor $C_{r2}$ (see $V_{Cr1}$ in FIG. 4) which has a retrace interval ($t_0-t_3$) and a trace interval ($t_3-t_6$) with lengths that generally differ from the interval lengths of voltage $V_{Cr2}$.

Consequently a saw-tooth current flows in coil $L_3$; current switching in this case being carried out by the parallel recovery diode $D_3$ and by transistor $T_r$ (via diode $D_2$).

The energy necessary to compensate the losses is supplied to the two circuits, previously described, in the following way:

When the driving signal supplied to the terminal $E_1$ renders transistor $T_r$ conduct ($t_4-t_6$ interval in FIG. 4), coil $L_1$ builds up energy which is supplied by the d.c. power supply connected to the terminals B+ and B−.

During the following interval ($t_0-t_4$) in which $T_r$ is blocked, the current in coil $L_1$ flows through the diode $D_1$ and charges the capacitors $C_1$ and $C_{r1}$ during the interval $t_0-t_3$ whilst it only charges the capacitor $C_1$ during the interval $t_3-t_4$ in which $D_3$ conducts.

The energy thus supplied to $C_1$ is then discharged back to the d.c. power supply through the coil $L_2$ and the thyristor $T_{y1}$ in the conduction interval of thyristor $T_{y1}$.

The control pulse (trigger) for $T_{y1}$ (applied to its gate $G_1$) can be advantageously synchronised with the control signal for $T_r$. That is to say the thyristor $T_{y1}$ can be triggered at the same time in which the transistor $T_r$ is made conductive.

If then, at time $t'_4$, the thyristor $T_{y2}$ is triggered, the energy still available in $C_1$ and $L_2$ is sent to $C_{r2}$ through $L_5$.

Suitable design parameters of the inductance coil $L_2$ ensure that the current in $T_{y1}$ and $T_{y2}$ is not excessive and that it extinguishes ($t'_5$) before the time $t_6$. In fact, it is essential for the required performance of the circuit that $C_1$ discharges before transistor $T_r$ is inhibited, in order to make possible the subsequent supply of energy from the power supply.

The trigger pulse applied to $T_{y2}$ is energised at time $t'_4$ which occurs between the times $t_4$ and $t'_5$.

By advancing or delaying the instant $t'_4$ one supplies more or less energy to the $L_y$-$C_{r2}$ circuit so that one can modulate the amplitude of the current flowing in the deflection coil $L_y$ without affecting the current flow in coil $L_3$.

In both described embodiments of the invention one can readily provide a control loop to slave the duration of the control signal of transistor $T_r$ to the voltage generated across $C_{r1}$ in such a way that it remains constant not only when the current in the deflection coil $L_y$ varies but also when either the power supply voltage or the loads coupled to the coil $L_3$ vary. For example, it is possible to make a coupling between coil $L_3$ and a step-up winding to obtain the E.H.T. for the picture tube accelerating electrode; in this way the E-W modulation does not affect the E.H.T. value.

I claim:

1. A circuit arrangement for driving saw-tooth current through a coil comprising a trace capacitor and a retrace capacitor, connected in a closed loop with said coil, a current recovery diode connected in parallel with the said retrace capacitor a first controllable switch, having a control electrode operative to receive periodic control signals to render the said first switch conductive during part of the trace interval, and an inductance connecting the said first switch to a power supply source in which energy is stored during the interval in which the said first switch is conductive and from which energy is supplied to the said retrace capacitor by way of a second diode and a third capacitor when the said first switch is not conductive, the energy stored in the said third capacitor when the said first switch is not conductive, being restored to the supply source when the said first switch is conductive by way of a second controllable switch.

2. A circuit arrangement as claimed in claim 1, wherein the said energy is operative to flow from the said inductance to the said retrace capacitor during the interval in which the said first switch is non-conductive, by way of a third controllable switch.

3. A circuit arrangement as claimed in claim 1, wherein the said second controllable switch is a thyristor.

4. A circuit arrangement as claimed in claim 2, wherein the said third controllable switch is a thyristor.

5. A circuit arrangement as claimed in claim 2, wherein the said energy is operative to flow from the said inductance to a second retrace capacitor connected to a second coil and to a second trace capacitor and that a controlled part of the said energy is transferred, through the said third switch to the said first retrace capacitor.

6. A circuit arrangement as claimed in claim 5, in which means are provided for controlling the conduction time of the said first switch so as to maintain the amplitude of the current in the said second coil constant, while the amplitude of the current in the said first mentioned coil is varied by controlling the instant at which the said third switch is triggered.

7. A circuit arrangement as claimed in claim 1, wherein part of the energy stored in the said third capacitor during the interval in which the said first controllable semiconductor switch is conductive, is sent to the retrace capacitor during the next interval in which the said first controllable semiconductor switch is conductive, by way of a third controllable semiconductor switch.

8. A circuit arrangement as claimed in claim 7, in which the said third controllable semiconductor switch is a thyristor.

9. A circuit arrangement as claimed in claim 7 or 8, in which means are provided for controlling the instant at which the said third controllable semiconductor switch is triggered so as to control the amplitude of the sawtooth current in the deflection coil.

10. A circuit arrangement as claimed in claim 9, in which means are provided for controlling the conduction time of the said first controllable semiconductor switch so as to maintain a constant amplitude of the current in a second coil coupled to a second retrace capacitor, and to the said third capacitor.

* * * * *